(12) United States Patent
Mori et al.

(10) Patent No.: US 8,833,923 B2
(45) Date of Patent: Sep. 16, 2014

(54) CONDUCTOR FORMING METHOD

(75) Inventors: Kentaro Mori, Inuyama (JP); Daisuke Uematsu, Aichi-gun (JP); Nobuhiro Hayakawa, Chita (JP)

(73) Assignee: NGK Spark Plug Co., Ltd., Aichi (JP)

( * ) Notice: Subject to any disclaimer, the term of this patent is extended or adjusted under 35 U.S.C. 154(b) by 203 days.

(21) Appl. No.: 13/325,635

(22) Filed: Dec. 14, 2011

(65) Prior Publication Data

US 2012/0154499 A1 Jun. 21, 2012

(30) Foreign Application Priority Data

Dec. 15, 2010 (JP) .................................. 2010-279801
Oct. 11, 2011 (JP) .................................. 2011-224257

(51) Int. Cl.
*B41J 2/01* (2006.01)
*B41J 2/17* (2006.01)
*B41J 3/407* (2006.01)
*H05K 3/12* (2006.01)

(52) U.S. Cl.
CPC .............. *H05K 3/1258* (2013.01); *H05K 3/125* (2013.01)
USPC .............. 347/102; 347/101; 347/95; 347/106

(58) Field of Classification Search
USPC ............................ 347/6, 7, 95, 102, 101, 106
See application file for complete search history.

(56) References Cited

U.S. PATENT DOCUMENTS

| 7,875,140 B2 * | 1/2011 | Kobayashi ................. 156/89.11 |
| 7,939,132 B2 | 5/2011 | Toyoda |
| 2005/0000414 A1 * | 1/2005 | Culik et al. .................... 118/200 |
| 2006/0169672 A1 * | 8/2006 | Toyoda ............................. 216/67 |
| 2007/0128855 A1 * | 6/2007 | Cho et al. ....................... 438/637 |
| 2010/0136376 A1 * | 6/2010 | Leah et al. ....................... 429/13 |
| 2010/0165031 A1 * | 7/2010 | Laaspere et al. ................ 347/14 |

FOREIGN PATENT DOCUMENTS

| JP | 2003-327960 A | 11/2003 |
| JP | 2005-116248 A | 4/2005 |
| JP | 2006-35820 A | 2/2006 |
| JP | 2006-212476 A | 8/2006 |
| JP | 2007-42385 A | 2/2007 |
| JP | 2008-33284 A | 2/2008 |
| JP | 2009-212249 A | 9/2009 |

OTHER PUBLICATIONS

Japanese Office Action issued on Feb. 20, 2014 for corresponding Japanese Patent Application No. 2011-253390.

\* cited by examiner

*Primary Examiner* — Sarah Al Hashimi
(74) *Attorney, Agent, or Firm* — Sughrue Mion, PLLC

(57) ABSTRACT

There is provided a method for forming a conductor, including a first printing step of printing a contour part of the conductor with a first printing ink, a drying step of drying the printed contour part, and a second printing step of printing a remaining part of the conductor with a second printing ink, wherein the second printing ink contains a conductive material and has a surface tension lower than or equal to a surface tension of the first printing ink.

10 Claims, 3 Drawing Sheets

CONDUCTOR FORMING METHOD

BACKGROUND OF THE INVENTION

The present invention relates to a method for forming a conductor such as an electron conductor or an ion conductor.

There is conventionally known ink-jet printing process in which a given ink pattern is printed on a print object such as a print paper or a substrate by means of an ink-jet head and, more specifically, by moving the print object in one direction while moving the ink-jet head in a direction perpendicular to the moving direction of the print object as disclosed in Japanese Laid-Open Patent Publication No. 2006-35820. In this printing process, the relative moving direction of the print object and the ink-jet head, i.e., the actual direction of pattern printing on the print object is always constant regardless of the pattern orientation (horizontal orientation or vertical orientation). Further, the ink-jet head is generally configured to, while moving the print object on a stage, apply pressure pulses to a molten ink and thereby discharge minute ink drops from its nozzles onto the print object during the printing process as disclosed in Japanese Laid-Open Patent Publication No. 2009-212249.

The above-mentioned ink-jet printing process can be adopted as various printing techniques, including not only plain-paper printing for printing an ordinary ink such as a color ink on a plain paper sheet but also conductor printing for printing a conductor (conductor pattern) on a circuit substrate. In particular, it is feasible by the ink-jet printing process to form an electrode (electrode pad) on a solid electrolyte substrate with the use of an ink containing a conductive material such as metal particles and to form a solid electrolyte thin film with the use of an ink containing a solid electrolyte material.

SUMMARY OF THE INVENTION

However, the ink-jet printing process presents the following problems. In the case of using an ink having a high surface tension due to its solid matter content, the ink gathers in the center of the printed pattern under high surface tension as it dries from the outer periphery of the printed pattern. This results in thickness variations between the outer periphery and center of the printed pattern. In the case of using an ink having a low surface tension, on the other hand, the ink spreads over the print object. This makes it difficult to print the ink pattern with a desired thickness. When the ink-jet printing process is adopted as the conductor forming technique, there is thus difficulty in limiting thickness variations in the conductor and forming the conductor with a desired thickness so that it is hard to achieve desired electrical characteristics of the conductor.

It is accordingly an object of the present invention to provide a conductor forming method by which a conductor can be formed uniformly with a desired thickness.

According to an aspect of the present invention, there is provided a method for forming a conductor, comprising: a first printing step of printing a contour part of the conductor with a first printing ink; a drying step of drying the printed contour part; and a second printing step of, after the drying step, printing a remaining part of the conductor with a second printing ink, the second printing ink containing a conductive material and having a surface tension lower than or equal to a surface tension of the first printing ink.

The other objects and features of the present invention will also become understood from the following description.

DESCRIPTION OF THE EMBODIMENTS

Figure 1:
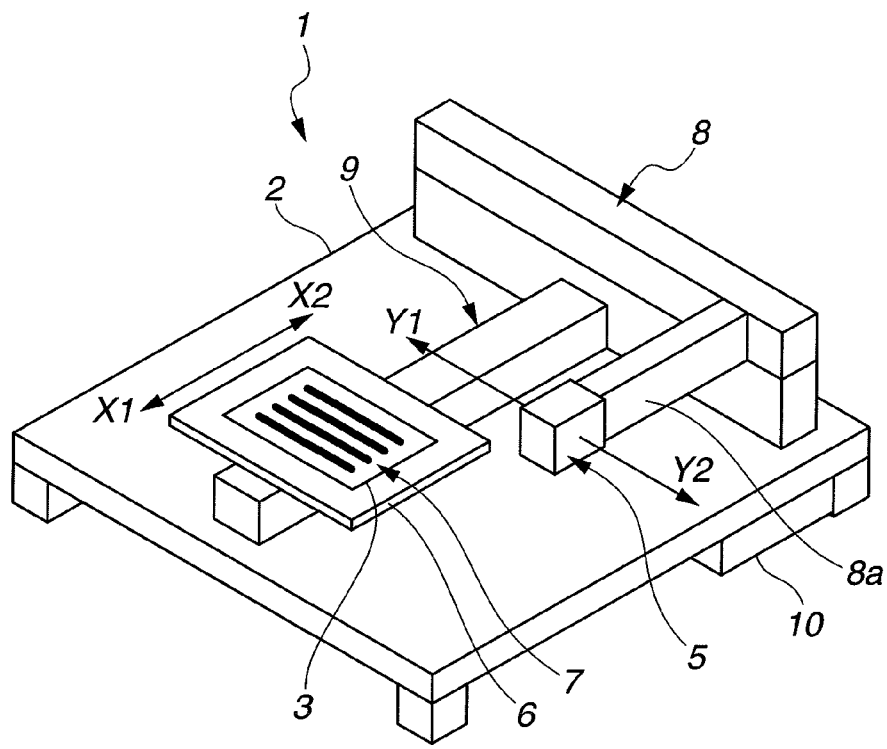
FIG. 1 is a schematic view of a conductor forming device in which the present invention can be embodied.

The present invention will be described in detail below by way of the following first to third embodiments.

First Embodiment

The first embodiment of the present invention refers to a conductor forming method for forming a conductor such as an electron conductor or an ion conductor, including a first printing step of printing a contour part of the conductor with a first printing ink, a drying step of drying the printed contour part and a second printing step of, after the drying step, printing a remaining part of the conductor (located inside the printed contour part) with a second printing ink, wherein the second printing ink contains a conductive material and has a surface tension lower than or equal to a surface tension of the first printing ink.

The contour part (outer periphery) of the conductor is first printed with the first printing ink of higher surface tension (lower wettability) in the first printing step and dried in the drying step. The thickness of the outer periphery of the conductor can be thus prevented from decreasing and becoming too small.

In the subsequent second printing step, the remaining inner part of the conductor is printed with the second printing ink of lower surface tension (higher wettability). The thickness of the inner part of the conductor (notably, the thickness of the center of the conductor) can be thus prevented from increasing and becoming too large under surface tension of the printing ink. Further, the second printing ink can be filled uniformly not only in the inner part of the conductor but also in the boundary between the contour part and inner part of the conductor as the contour part of the conductor has been solidified in the drying step and functions as a bank wall in the second printing step.

It is therefore possible in the present embodiment to limit variations in the thickness of the conductor and form the conductor with a desired uniform thickness even when the area of the conductor is relatively large. This enables a thickness reduction throughout the conductor and makes it possible to limit variations in the internal resistance of the conductor whereby the conductor can achieve desired electrical characteristics.

Each of the first printing ink and the second printing ink is prepared from a binder, a solvent and optionally an additive component(s) such as a dispersant.

The first printing ink preferably contains a conductive material, whereas the second printing ink essentially contains a conductive material as mentioned above. The conductive material can be either an electron-conductive material or an ion-conductive material. Examples of the electron-conductive material usable in the first and second printing inks are metals such as gold, silver, copper and platinum and metal oxides such as zirconia and alumina. Examples of the ion-conductive material usable in the first and second printing ink are solid electrolyte materials such as zirconia. The conductive material is not however limited to these materials. In other words, any electron-conductive ink or ion-conductive ink can be used freely as the first printing ink. As the major part of the conductor is formed of the second printing ink, the performance characteristics of the conductor are attributed to the properties of the second printing ink. Even in the case where an expensive ink material (such as platinum powder) is used in the second printing ink, it is possible to reduce the cost of the printing ink by the use of an inexpensive ink material in the first printing ink.

The first printing ink also preferably contains a combustible material such as carbon (solid matter) that can be burned out at temperatures lower than or equal to a firing temperature of the conductor. When the combustible material is burn out during firing, the thickness of the contour part of the conductor decreases by the amount of the combustible material. It is thus possible to effectively limit thickness variations between the outer periphery and center of the conductor even in the case where the inner part of the conductor is printed with the second printing ink of relatively low surface tension in the second printing step.

Alternatively, the first printing ink may contain a combustible material without any electron- or ion-conductive material. The elimination of use of the electron- or ion-conductive material in the first printing ink leads to a further cost reduction.

The surface tension of the printing ink can be easily controlled by changing the kind and/or amount of the binder contained and dissolved in the solvent. For example, it is feasible to control the surface tension of the second printing ink to be lower than or equal to the surface tension of the first printing ink by selecting and using different kinds of binders as the binders of the first and second printing inks in such a manner that the binder of the second printing ink has a lower surface tension than that of the binder of the first printing ink, or by adjusting the amount of the binder in the second printing ink to be smaller than the amount of the binder in the first printing ink. The application of the lower-surface-tension printing ink to the inner part of the conductor is particularly effective in preventing the center of the conductor from increasing in thickness and securing the uniform small thickness (flat thin-film form) of the conductor.

The thus-formed conductor has a multitude of uses as internal parts in gas sensors, fuel cells, semiconductor devices and the like.

One preferred example of use of the conductor is as a thin-film solid electrolyte member (i.e. an ion conductor) in a solid oxide fuel cell (SOFC) etc. As the solid electrolyte member can be formed with a desired uniform small thickness of e.g. 0.5 to 5.0 μm, it is possible to reduce the ohmic resistance of the solid electrolyte member and provide good electrical characteristics to the SOFC. Even in the case of pursuing to decrease the thickness of the solid electrolyte member, it is possible to prevent mixing of fuel and oxygen as there is no fear of a defect such as a pinhole in the solid electrolyte member.

Another preferred example of use of the conductor is as an electrode or electrode pad (i.e. an electron conductor) on a solid electrolyte substrate in a gas sensor etc. It is possible to limit variations in the internal resistance of the electrode or electrode pad and obtain improvement in sensor responsivity as the electrode can be formed with a desired uniform small thickness of e.g. 0.1 to 5.0 μm.

In the present embodiment, the second printing step is preferably performed at lower resolution than that of the first printing step. In this case, the contour part of the conductor can be printed at high resolution and high accuracy; and the remaining inner part of the conductor is printed at low resolution and high speed. It is thus possible to shorten the printing time of the conductor in addition to securing the uniform small thickness of the conductor by controlling the thickness (height) of the outer periphery of the conductor accurately while preventing the center of the conductor from increasing in thickness.

Further, at least the first printing step is preferably performed by ink-jet printing process. In the ink-jet printing process, the printing ink can be discharged as minute liquid drops. If the contour part of the conductor is printed in advance by screen printing with a low-surface-tension printing ink, the printing ink spreads so that it is difficult to maintain the form of the contour part of the conductor. However, when the contour part of the conductor is printed with minute ink drops of the first printing ink by ink-jet printing process, the discharged minute ink drops can be dried quickly so as to prevent spread of the first printing ink and control the form of the contour part of the conductor accurately. It is possible to obtain the desired effect even when the remaining part of the conductor is printed with the second printing ink by screen printing process. More preferably, both of the first and second printing steps are performed by ink-jet printing process. It is possible to form the conductor accurately with a desired uniform small thickness by printing the contour part of the conductor with minute drops of the first printing ink and then printing the remaining inner part of the conductor with minute drops of the second printing ink.

The ink-jet printing process can be conducted by a printing device 1 as shown in FIG. 1. The printing device 1 is herein configured to form a plurality of rectangular conductor patterns 7 on a substrate 3 by ink-jet printing and is equipped with a base plate 2, a print head (ink-jet head) 5, a stage 6, a head moving mechanism 8, a stage moving mechanism 9 and a control unit 10. In the present embodiment, the substrate 3 consists of a plurality of rectangular substrate units (e.g. 48 substrate units) on which the conductor patterns 7 are formed, respectively. These substrate units are arranged in the same orientation. The substrate 3 is formed in one piece and finally divided into the separate substrate units.

The print head 5 has a plurality of nozzles (e.g. 128 nozzles) and a piezoelectric element as a drive element so as to discharge ink drops through the nozzles by the application of pressure to the piezoelectric element. The nozzles are arranged in parallel at a given pitch (e.g. 508 μm) along a direction intersecting a main scanning direction Y1-Y2 of the print head 5. Further, the print head 5 has the head angle adjusting function to adjust the angle of the print head 5 relative to the main scanning direction Y1-Y2 and thereby change the dot pitch (resolution) of the conductor pattern 7. (When the head angle adjusting function is not actuated, the nozzles are aligned along a sub-scanning direction X1-X2 perpendicular to the main scanning direction Y1-Y2.)

The stage 6 supports thereon the substrate 3 in such a manner that the longitudinal sides of the substrate units are aligned in the main scanning direction Y1-Y2 of the print head 5 (the longitudinal direction of the conductor pattern 7 to be formed on the substrate 3 is in agreement with the main scanning direction of the print head 5).

The head moving mechanism 8 includes a drive motor (as a power source), a ball screw driven by the drive motor and an arm 8a having a base end engaged with the ball screw and a distal end supporting the print head 5 so as to move the print head 5 in the main scanning direction Y1-Y2.

The stage moving mechanism 9 holds thereon the stage 6 and includes a drive motor (as a power source) and a ball screw driven by the drive motor so as to move the stage 6 in the sub-scanning direction X1-X2 with the substrate 3 supported on the stage 6.

The substrate 3 and the print head 5 are shifted in position relative to each other by the head moving mechanism 8 and the stage moving mechanism 9.

The control unit 10 generates various control signals (voltage signals), including an actuation signal to enable the print head 5 (the piezoelectric element) to discharge the conductor printing ink through the nozzles, a drive signal to enable the head moving mechanism 8 (the drive motor) to move the print head 5 in the main scanning direction Y1-Y2 and a drive signal to enable the stage moving mechanism 9 (the drive motor) to move the stage 6 in the sub-scanning direction X1-X2, so that the print head 5 can print the conductor pattern 3 at a desired position on the substrate 3.

The ink-jet printing is thus carried out by the print head 5, the head moving mechanism 8 and the stage moving mechanism 9 under the control signals from the control unit 10.

Figure 2:
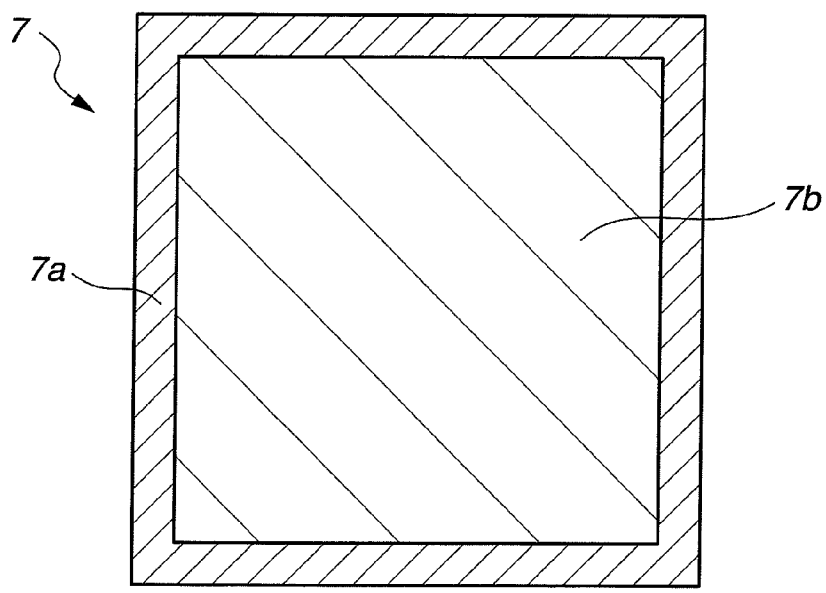
FIGS. 2 and 3 are horizontal and vertical section views of a conductor pattern formed by a conductor forming method according to a first embodiment of the present invention.
Figure 3:
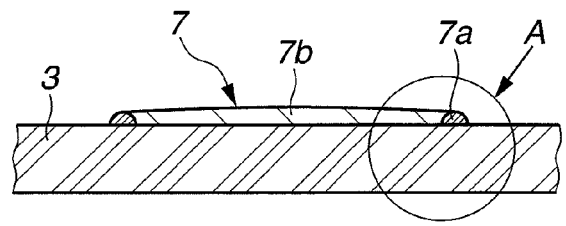
Figure 4:
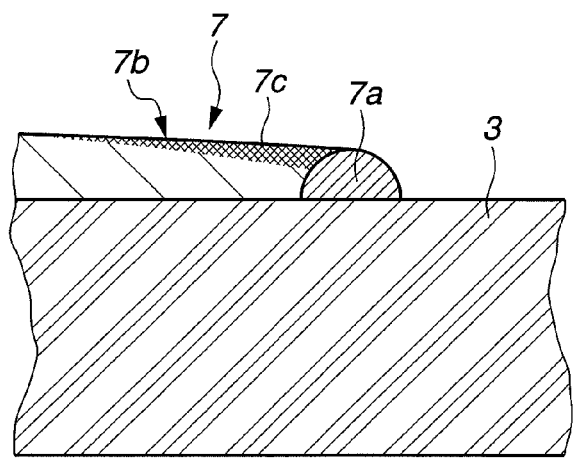
FIG. 4 is an enlarged view of area A in FIG. 3.

The conductor forming method of the present embodiment will be explained in more detail below by taking, as one example, the case where the conductor pattern 7 is formed as an electrode pad as shown in FIGS. 2 to 4 by the use of the printing device 1. The electrode pad is a component part disposed on an end of a lead (as a signal transmission path) for input/output of electric signals. The substrate 3 and the lead are herein omitted in FIG. 2 for the purposes of clarifying the technical features of the conductor forming method of the present embodiment.

In the present embodiment, the substrate 3 is first placed on the stage 6.

A contour part 7a of the conductor pattern 7 is then printed with the first printing ink by the printing device 1 in the first printing step.

The printed contour part 7a is dried in the drying step. There is no particular limitation on the drying conditions in the drying step. For example, it is feasible to perform the drying step by heat treatment at around 100° C. for 2 to 3 minutes so as to vaporize the solvent from the printing ink and thereby solidify the printed contour part 7a.

After that, the whole of a remaining part 7b of the conductor pattern 7 (located inside the dried printed contour part 7a) is printed with the second printing ink by the printing device 1 in the second printing step.

Herein, each of the first and second printing inks used in the present embodiment contains 66 mass % of butyl carbitol acetate as a solvent, 28 mass % of platinum as a metal, 4 mass % of zirconia as a metal oxide, 1 mass % of a binder and 1 mass % of a dispersant etc. Further, a cellulosic binder is used as the binder of the first printing ink; and an acrylic binder (of lower surface tension than that of the cellulosic binder) is used as the binder of the second printing ink in the present embodiment.

Figure 5:
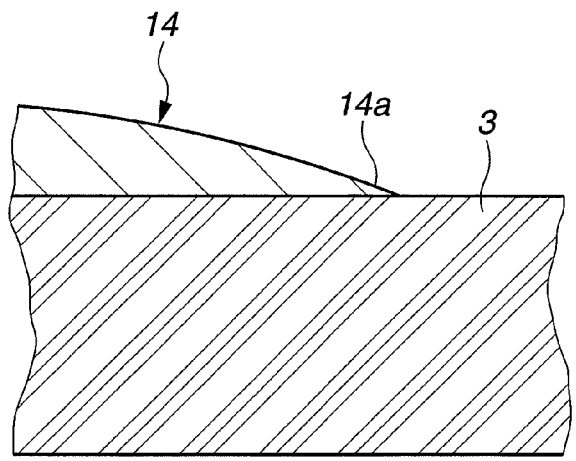
FIG. 5 is a vertical section view of a conductor pattern formed by a conventional conductor forming method.

On the other hand, in a conventional conductor forming method, the whole of a conductor pattern 14 is printed in one printing step with a conductor printing ink as shown in FIG. 5. Under surface tension of the printing ink, the thickness of an outer periphery 14a of the conductor pattern 14 decreases with increase in the thickness of the center of the conductor pattern 14. There arises a large thickness variation between the outer periphery 14a and center of the conductor pattern 14. As a result, the conductor pattern 14 is formed into a semicylindrical shape. The amount of application of the conductor printing ink, in which an expensive platinum power material is often used, increases as the thickness of the conductor pattern 14 becomes larger than desired. The conventional conductor forming method thus faces the problems of cost increase and variations in the internal resistance of the conductor pattern 14.

In the present embodiment, by contrast, the contour part 7a of the conductor pattern 7 is printed with the first printing ink of higher surface tension and solidified in advance so as to substantially reduce the influence of the surface tension of the printing ink on the contour part 7a and prevent the contour part 7a from decreasing in thickness. The remaining inner part 7b is then subsequently printed with the second printing ink of lower surface tension so as to prevent the center of the conductor pattern 7 from increasing in thickness. As the solidified contour part 7a has been solidified and function as a bank wall, the second printing ink is filled uniformly not only in the remaining inner part 7b of the conductor part 7 but also in the boundary 7c between the contour part 7a and inner part 7b of the conductor pattern 7 (i.e. the area indicated by cross hatching in FIG. 4). The conductor pattern 7 can be thus formed into a flat thin film. It is therefore possible to limit variations in the thickness of the conductor pattern 7 and secure a uniform thickness throughout the conductor pattern 7 even when the conductor pattern 7 is of relatively large area. It is also possible to reduce the consumption cost of the printing ink as the conductor pattern 7 can be formed with a desired small thickness. As mentioned above, the application of the lower-surface-tension printing ink to the inner part 7b of the conductor pattern 7 is effective in preventing the center of the conductor pattern 7 from increasing in thickness and securing the uniform small thickness (flat thin-film form) of the conductor pattern 7.

Furthermore, both of the first and second printing inks are discharged as minute liquid drops by the ink-jet printing process so as to print the contour part 7a of the conductor pattern 7 with minute drops of the first printing ink and then print the remaining inner part 7b of the conductor pattern 7 with minute drops of the second printing ink. It is thus possible to control the entire form of the conductor pattern 7 accurately to a desired uniform small thickness.

In the first and second printing steps, the angle of the print head 5 may be adjusted to change the dot pitch (nozzle pitch) in such a manner as to print the contour part 7a of the conductor pattern 7 at higher resolution and high accuracy and print the remaining inner part 7b at lower resolution and high speed. For example, it is feasible to print the contour part 7a at a dot pitch of 35 µm (at a resolution of 726 dpi) and print the remaining inner part 7b at a dot pitch of 50 µm (at a resolution of 508 dpi) in the case where the conductor pattern 7a is about 2.7 mm square. In this case, it is possible to not only form the conductor pattern 7 with the uniform small thickness but also shorten the printing time of the conductor pattern 7.

In this way, the conductor forming method of the present embodiment makes it possible to form the conductor with a desired uniform thickness and limit variations in the internal resistance of the conductor so that the conductor can achieve desired electrical characteristics.

Second and Third Embodiments

The second and third embodiments of the present invention are similar to the first embodiment of the present invention, except that the conductor forming method includes, before the drying step, printing an aggregation preventing part inside the contour part of the conductor in such a manner that the aggregation preventing part has the function of preventing aggregation of the second printing ink in the second printing step. It is preferable to print the aggregation preventing part simultaneously with the contour part of the conductor in the first printing step. That is, the surface tension of the printing ink and the printing resolution of the aggregation preventing part are preferably the same as those of the contour part of the conductor.

Figure 6:
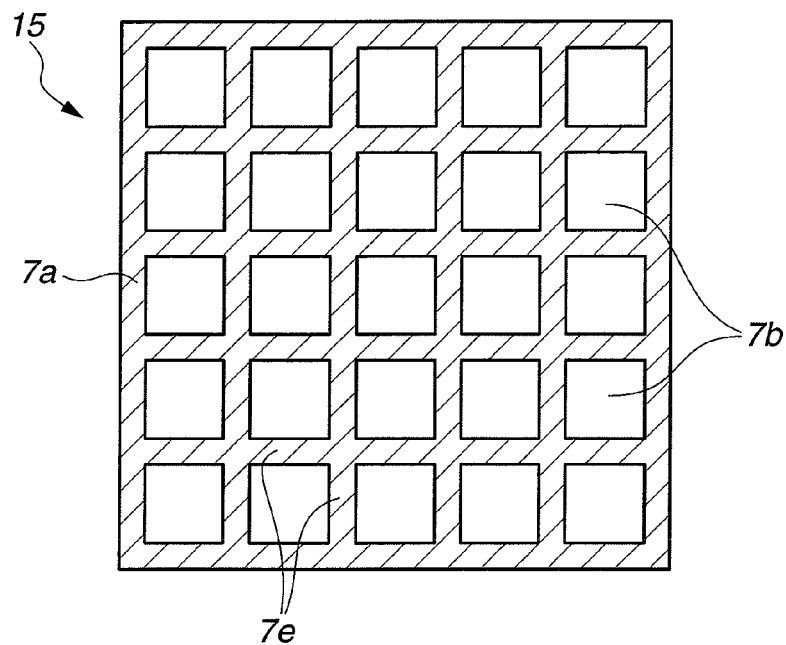
FIG. 6 is a horizontal section view of a conductor pattern formed by a conductor forming method according to a second embodiment of the present invention.
Figure 7:
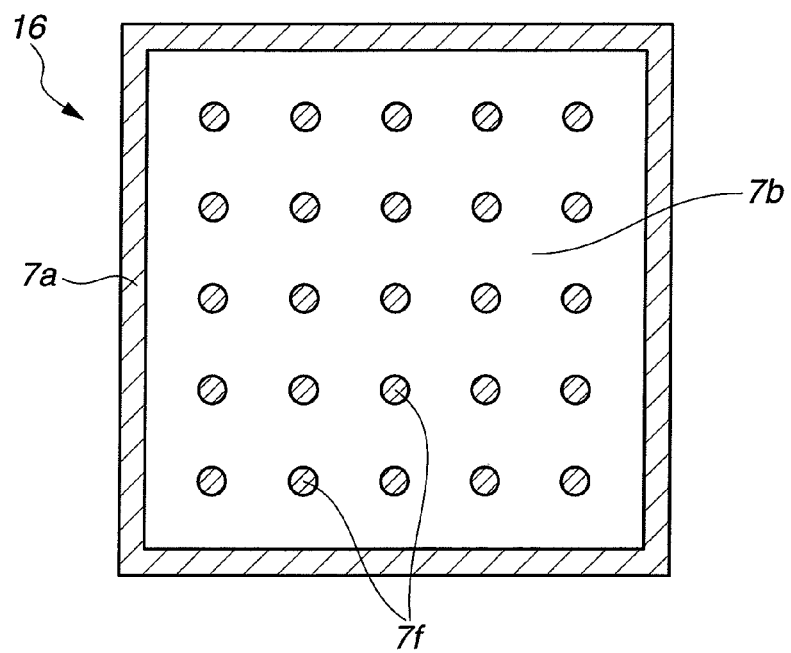
FIG. 7 is a horizontal section view of a conductor pattern formed by a conductor forming method according to a third embodiment of the present invention.

By way of example, it is assumed that a conductor pattern 15 or 16 is formed as shown in FIG. 6 or 7 in the second or third embodiment as in the case of the first embodiment. In this case, the first and third printing steps are preferably simultaneously performed so that the first printing ink is printed to form not only a contour part 7a of the conductor pattern 15, 16 but also an aggregation preventing part 7e, 7f within the inside of the contour part 7a. In the drying step, the aggregation preventing part 7e, 7f is dried simultaneously with the contour part 7a of the conductor pattern 15, 16. Then, the second printing step is performed so that the second printing ink is printed on the remaining part 7b of the conductor pattern 15, 16 other than the contour part 7a and the aggregation preventing part 7e, 7f.

There is no particular limitation on the form of the aggregation preventing part 7e, 7f as long as it is capable of preventing aggregation of the second printing ink in the second printing step.

The aggregation preventing part 7e is preferably provided in a net form as shown in FIG. 6 in the second embodiment.

Further, the aggregation preventing part 7f is preferably provided in the form of a plurality of protrusions as shown in FIG. 7 in the third embodiment.

By the formation of such an aggregation preventing part 7e, 7f, the second printing ink can be prevented from aggregation in the second printing step so as to effectively prevent the center of the conductor pattern 15, 16 from becoming increased in thickness. It is thus possible in the second and third embodiments to obtain the same effects as in the first embodiment and to secure the uniform thickness of the conductor pattern 15, 16 more assuredly.

The entire contents of Japanese Patent Application No. 2010-279801 (filed on Dec. 15, 2010) and No. 2011-224257 (filed on Oct. 11, 2011) are herein incorporated by reference.

Although the present invention has been described with reference to the above specific embodiments, the present invention is not limited to these exemplary embodiments. Various modification and variation of the embodiments described above will occur to those skilled in the art in light of the above teachings.

For example, the conductor forming method may be modified to use an insulating ink in place of the conductor printing ink and form an insulating pattern on a given area on a substrate.

There is no particular limitation on the form of the conductor in the present invention. Although the conductor pattern 7, 15, 16 is square in shape in the first to third embodiments, the conductor can be formed in any other shape such as circular shape.

The scope of the invention is defined with reference to the following claims.

What is claimed is:

1. A method for forming a conductor, comprising:
    a first printing step of printing a contour part of the conductor with a first printing ink such that the contour part extends along an outer periphery of the conductor;
    a drying step of drying the printed contour part; and
    a second printing step of printing a remaining part of the conductor with a second printing ink, the second printing ink containing a conductive material and having a surface tension lower than or equal to a surface tension of the first printing ink,
    said method further comprising, before the drying step, printing an aggregation preventing part inside the contour part of the conductor, wherein the aggregation preventing part is dried simultaneously with the contour part of the conductor in the drying step; and wherein the second printing ink is printed on the remaining part of the conductor other than the contour part and the aggregation preventing part in the second printing step.

2. The method according to claim 1, wherein the first printing ink contains either an electron-conductive material or an ion-conductive material.

3. The method according to claim 1, wherein the first printing ink contains a combustible material.

4. The method according to claim 1, wherein each of the first printing ink and the second printing ink contains a binder and a solvent; and wherein the conductor forming method further comprises controlling either or both of the surface tension of the first printing ink and the surface tension of the second printing ink by adjusting at least one of the amount and kind of the binder dissolved in the solvent.

5. The method according to claim 1, wherein the aggregation preventing part is printed simultaneously with the contour part of the conductor in the first printing step.

6. The method according to claim 1, wherein the aggregation preventing part is printed in a net form.

7. The method according to claim 1, wherein the second printing step is performed at lower resolution than that of the first printing step.

8. The method according to claim 1, wherein the first printing step is performed by ink-jet printing process.

9. The method according to claim 1, wherein the conductor is a solid electrolyte member.

10. The method according to claim 1, wherein the conductor is an electrode on a solid electrolyte substrate.

* * * * *